United States Patent [19]

Chang et al.

[11] Patent Number: 4,477,729

[45] Date of Patent: Oct. 16, 1984

[54] CONTINUOUSLY WRITING ELECTRON BEAM STITCHED PATTERN EXPOSURE SYSTEM

[75] Inventors: Tai-Hon P. Chang, Chappaqua; Alan D. Wilson, Mt. Kisco, both of N.Y.

[73] Assignee: International Business Machines Corporation, Armonk, N.Y.

[21] Appl. No.: 432,170

[22] Filed: Oct. 1, 1982

[51] Int. Cl.³ .................... H01J 37/304; H01J 37/302
[52] U.S. Cl. ................................................ 250/492.2
[58] Field of Search ..................................... 250/492.2

[56] References Cited

U.S. PATENT DOCUMENTS 4,132,898  1/1979  Buelow et al. .................. 250/492.2
4,147,937  4/1979  Buelow et al. .................. 250/492.2

OTHER PUBLICATIONS

Chang et al., "A Computer-Controlled Electron-Beam Machine . . . ", *IEEE Transactions on Electron Devices*, vol. ED-19, No. 5, May 1972, pp. 629-635.

*Primary Examiner*—Janice A. Howell
*Assistant Examiner*—Jack I. Berman
*Attorney, Agent, or Firm*—Ronald L. Drumheller

[57] ABSTRACT

A large lithographic pattern is written as quickly as possible by writing successive subpatterns in a vector scan mode of operation without any interruption between successive subpatterns. This is made possible by arranging the subpatterns so that they are adjacent to each other and are preferably overlapping and by gradually moving the workpiece with respect to the writing field so as to always keep the subpattern being written within the writing field of the beam. The speed and direction of the workpiece movement (relative to the writing field) is not predetermined for all patterns but is controlled instead by the pattern being written. A sparsely written pattern or portion of a pattern is accompanied by a more rapid table movement than what accompanies a densely written pattern or portion of a pattern. This is made possible by embedding pattern determined workpiece movement commands within the pattern defining data. Through the workpiece movement commands, relative movement between the workpiece and the writing field may be continuously controlled with respect to movement direction, velocity and acceleration.

The desired relative position of the workpiece is continuously updated in tiny increments while a laser interferometer control system measures the error between the actual workpiece position and the desired workpiece position and causes the workpiece to track the desired position.

11 Claims, 13 Drawing Figures

FIG. 5.1 CONTROL WORD

FIG. 5.2 SHAPE POSITION DATA WORD

FIG. 5.3 SHAPE DIMENSION DATA WORD

FIG. 5.4 DELAY & CLOCK DATA WORD

FIG. 5.5 AUXILIARY REGISTER WORD ial pattern writing with a steered energy beam. More particularly it relates to a writing beam exposure system of the vector scan type wherein a plurality of smaller subpatterns are combined to produce a larger total pattern without interrupting pattern writing.

CONTINUOUSLY WRITING ELECTRON BEAM STITCHED PATTERN EXPOSURE SYSTEM

DESCRIPTION

Technical Field

This invention relates to pattern writing with a steered energy beam. More particularly it relates to a writing beam exposure system of the vector scan type wherein a plurality of smaller subpatterns are combined to produce a larger total pattern without interrupting pattern writing.

Background Art

In recent years the complexity of integrated microcircuits has been increasing rapidly. This has been made possible in part by a reduction in the size of fabricated lines and primitive elements and in part by an increase in the area covered by an integrated circuit. Both of these changes place greater demands upon the lithography systems used to fabricate integrated microcircuits.

Lithography patterns of the highest resolution are produced by writing a pattern with a computer controlled particle or energy beam such as an electron beam. Current systems of this type frequently have a limited writing field size which is smaller than the size of the high resolution patterns desired. In order to obtain a high resolution pattern over a large field, smaller high resolution subpatterns are combined or "stitched" together.

Since computer controlled beam writing systems are expensive, the overall time it takes to complete a stitched pattern is economically very important. Accordingly, it is desirable to save time whenever possible.

Since most beam writing processes require that the writing beam deposit a minimum dose of energy or particles in order to produce a desired physical or chemical effect, there exists a minimum writing time which cannot be reduced farther without either increasing the beam power or increasing the sensitivity of the material upon which the writing is being done. This minimum writing time consists of the sum of all periods during which the writing beam is actually striking the workpiece. Ordinarily, there are also times during which the beam is not striking the workpiece and other operations are taking place. The overall time it takes to complete a stitched pattern is the sum of these two. In general, a stitched pattern may be written more quickly by reducing the periods during which the beam is not actually hitting the workpiece.

Early beam writing systems typically scanned an entire pattern field. The beam was blanked (i.e. turned off) at times corresponding to locations in the scan pattern where no beam induced marking was desired. Systems of this type are sometimes called the raster scan type. In a pattern where only half of the scanned area is actually marked by the beam, this means that the beam is blanked half the time during the scan period.

Vector scan systems seek to eliminate much of this blanked time by directly deflecting the beam at maximum velocity from one region which has been hit or painted by the beam to the next such region without scanning any areas which are not to be hit by the beam. If the beam can be instantly moved or vectored from one writing location to the next, then blanked time would be zero. In reality, deflection of a beam from one location to another within a writing field takes some time during which the beam must be effectively blanked. However, the blanked time is dramatically reduced by using a vector scan mode of operation rather than a raster scan mode.

Another area where time also can be saved is in moving the workpiece with respect to the writing field. Any stitching technique necessarily involves movement of the workpiece upon which the lithographic pattern is being written with respect to the writing field of the writing beam. With early stitching methods, after each subpattern was written, the workpiece was moved to a new position and the writing field realigned with respect to workpiece markers. Since each subpattern was aligned with respect to physical marks, stitching positional accuracy depended only upon alignment accuracy. One problem with this method is that considerable time is required to do each alignment. Time is also required to move the workpiece from one position to another and let mechanical vibrations settle. Another problem is that space is taken by the markers. With very large patterns, marks must be placed within the pattern, which furthermore enlarges the pattern and increases cost.

Since alignments take valuable time, more recent systems have sought to eliminate the need for realignments by using a laser interferometer to accurately measure the position of the workpiece. When the workpiece is moved to a new position, the laser interferometer senses the change in position so that an alignment step is not needed each time.

Ordinarily the workpiece is moved to a new position and relative motion is completely stopped before writing of the next subpattern is commenced. This also takes valuable time. More sophisticated recent systems seek also to reduce or eliminate this time as well. Laser interferometer controlled systems are known which have dynamic position correction capability so that writing of a new subpattern can commence before the workpiece has completely arrived at the new position and has stopped moving.

Illustrative of prior art beam writing systems with subpattern stitching are the following:

U.S. Pat. No. 3,900,737 by Collier et al., entitled "Electron Beam Exposure System";

U.S. Pat. No. 4,147,937 by Buelow et al., entitled "Electron Beam Exposure System Method and Apparatus"; and A. D. Wilson et al., "A Comparison of Pattern Stitching by Subfield Registration and Laser Interferometer Servo Control," MICROCIRCUIT ENGINEERING, Ed. by H. Ahmed and W. Nixon, pp. 355-365 (Cambridge Press, 1980).

BRIEF DESCRIPTION OF THE DRAWINGS

FIGS. 3.1-3.5 illustrates four successive subpatterns and the complete pattern formed thereby.

FIGS. 5.1-5.5 illustrate data formats used in connection with the system of FIG. 4.

DISCLOSURE OF THE INVENTION

In accordance with this invention, a large lithographic pattern is written as quickly as possible by writing successive subpatterns in a vector scan mode of operation without any interruption between successive subpatterns. This is made possible by arranging the subpatterns so that they are adjacent to each other and are preferably overlapping and by gradually moving the workpiece with respect to the writing field so as to always keep the subpattern being written within the writing field of the beam. The speed and direction of the workpiece movement (relative to the writing field) is not predetermined for all patterns but is controlled instead by the pattern being written. A sparsely written pattern or portion of a pattern is accompanied by a more rapid table movement than what accompanies a densely written pattern or portion of a pattern. This is made possible by embedding pattern determined workpiece movement commands within the pattern defining data. Through the workpiece movement commands, relative movement between the workpiece and the writing field may be continuously controlled with respect to movement direction, velocity and acceleration.

The desired relative position of the workpiece is continuously updated in tiny increments while a laser interferometer control system measures the error between the actual workpiece position and the desired workpiece position and causes the workpiece to track the desired position. Preferably the desired workpiece position is continuously updated in tiny increments by distributing incremental position changes within the pattern data. By distributing the incremental workpiece position changing commands within the pattern data in accordance with the execution rate of the pattern data, the velocity and acceleration of the relative movement can be completely controlled.

Pattern data for each subpattern is described in relation to a reference position for the workpiece (with respect to the writing field). The position of a subpattern being written is continuously corrected by an amount equal to the difference between the reference position of the workpiece associated with that subpattern and the position of the workpiece. The reference position of the workpiece for each subpattern is generally different.

Figure 1:
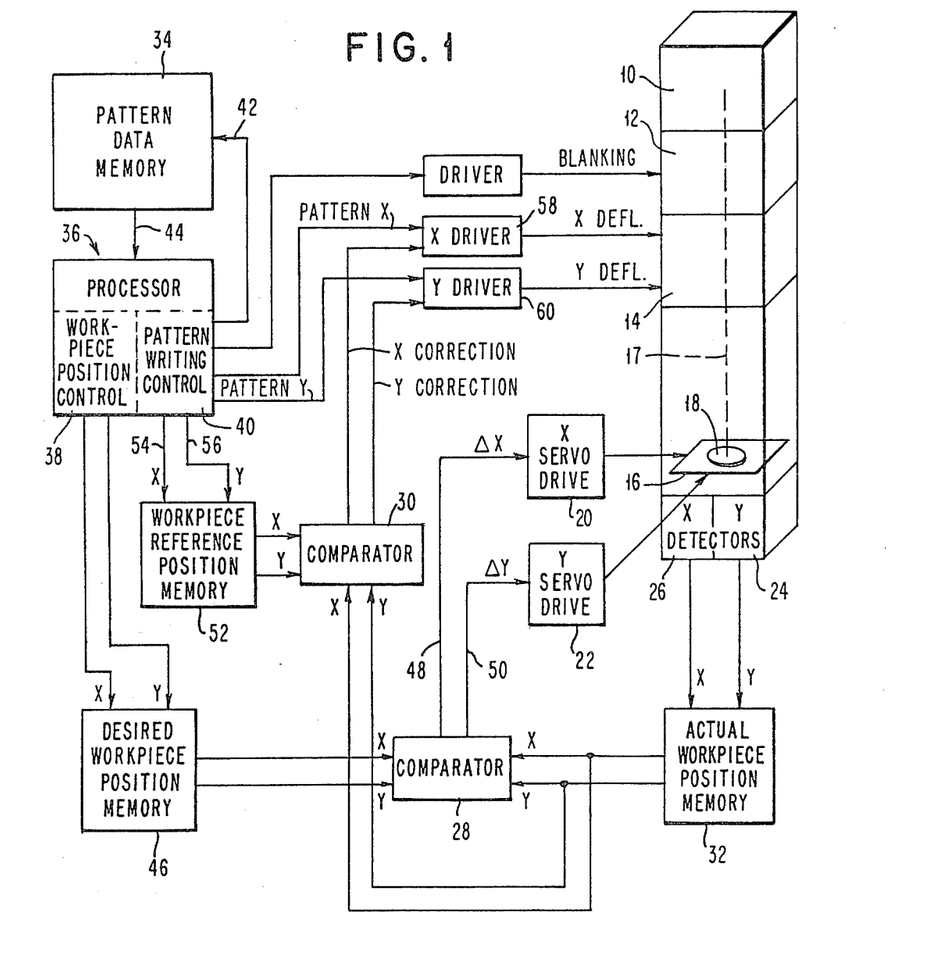
FIG. 1 is a general block diagram of a deflected beam exposure system in accordance with this invention.

FIG. 1 generally illustrates this invention. Beam source 10 is controllably turned on and off by blanking apparatus 12 and deflected by deflection apparatus 14. While an electron beam source is contemplated other types of deflectable beams could be employed instead, such as ion beams, etc. Table 16 carries a workpiece 18 for exposure to a deflected beam 17 controlled by deflection apparatus 14. Table 16 is positionable in two directions, X and Y, by X and Y servo motors 20, 22, respectively. The actual position of the workpiece relative to the deflected beam field is measured by X position detector 26 and by Y position detector 24, which may be a two axis laser interferometer, for example. The current relative position of the workpiece is supplied to comparators 28 and 30. The current measured relative position of the workpiece may be supplied to comparators 28, 30 directly by the position detectors or indirectly via a memory 32, which may be a pair of registers, for example.

Pattern writing data with table position data embedded therein is stored in a memory 34. In operation, the two types of data are separated during serial execution of the pattern writing data. This is done in this schematical representation by a processor 36 having a workpiece position control part 38 and a pattern writing control part 40.

It is generally contemplated by this invention that pattern writing will proceed without interruption. Accordingly, the pattern writing control part 40 controls via line 42 the flow of data from memory 34 along the line 44 to processor 36. The pattern writing control part 40 generally controls deflection apparatus 14 and blanking apparatus 12 so as to write a complete stitched pattern without interruption.

Workpiece position control data embedded within the pattern writing data is extracted by the workpiece position control part 38 of processor 36 and continuously updates a desired position for the table, which is stored in a memory device 46. The workpiece position control data changes the desired workpiece position only very gradually and in very small increments.

Comparator 28 measures the difference between the actual workpiece position stored in memory 32 and the desired workpiece position stored in memory 46. Servo motors 20, 22 respond to the measured difference via lines 48, 50 and drive the table so as to reduce the difference.

Pattern data is defined with respect to a particular reference position for the workpiece. This reference position is stored in memory 52. Periodically as pattern data is serially executed by the writing control part 40, this reference position is changed by a data word via lines 54, 56.

Comparator 30 measures the difference between the actual workpiece position stored in memory 32 and the reference position stored in memory 52 and and supplies beam position correction signals $\delta X$, $\delta Y$ to the beam deflection drivers 58, 60, corresponding in magnitude to the measured difference. The drivers add the position correction signals to the pattern forming signals and drive the deflection apparatus 14 with the summed signals. The correction signal shifts the actual position of the pattern being written by exactly the amount by which the measured current position of the workpiece differs from the reference position so as to position the pattern part being written on the workpiece at the exact position where it would be if the workpiece were exactly at the reference position and no correction were made.

Best Mode For Carrying Out The Invention

Figure 2:
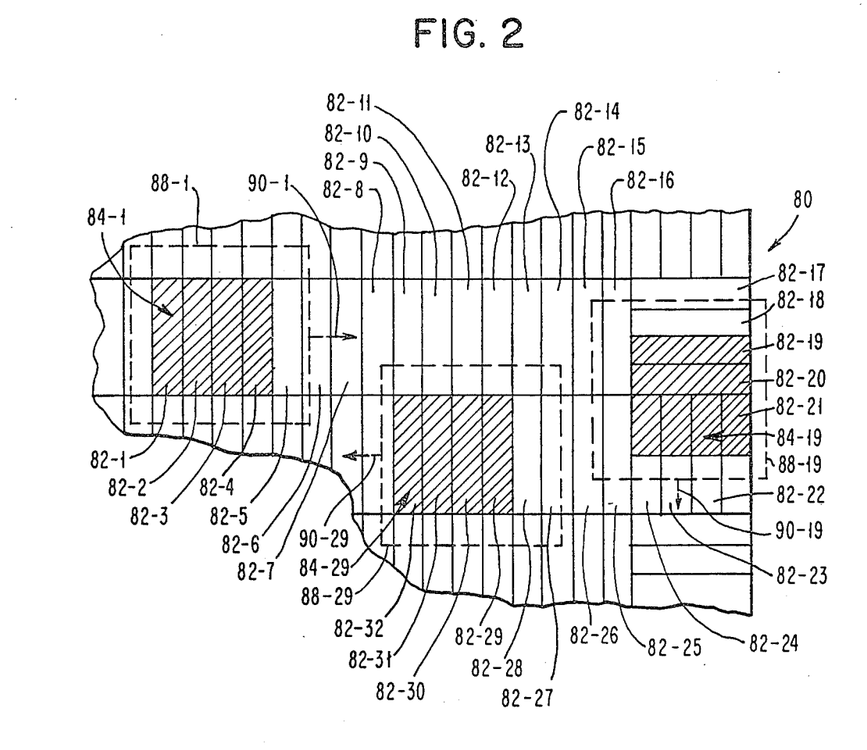
FIG. 2 is a plan view of an edge portion of a stitched pattern illustration the relationships between successive subpattern writing fields and the maximum writing field at different times during pattern writing.

The invention will now be described by reference to FIGS. 2-4, which illustrate a preferred embodiment of the invention, wherein a steered electron beam forms an electron beam pattern for fabrication of a high resolution lithographic mask useful in the production of microcircuits. FIG. 2 illustrates the relationships between successive subpattern writing fields and the maximum writing field as successive subpatterns are written without interruption. An edge portion of the complete pattern 80 has been subdivided into an array of rectangularly shaped subareas 82, some of which are labelled 82-1 through 82-32. It should be understood that the subarea boundaries are not part of the pattern and are shown for illustration purposes only. These subareas correspond to successive regions in the pattern to be written which are not shared with the next successive subpattern writing field and which therefore should be completely written before the system goes on to the next successive subpattern writing field. It will be assumed that a subpattern writing field has the same size and shape as four adjacent subareas. For illustration, three subpattern writing fields are shaded and labelled 84-1, 84-19, and 84-29. Successive subpattern writing fields correspond to a shift in position of one subarea. For example, subpattern writing field 84-2 (not labelled) would cover subareas 82-2, 82-3, 82-4 and 82-5. Thus, subpattern writing field 84-2 includes or overlaps all of the subpattern writing field 84-1 except for the 82-1 subarea. The subareas are, in fact, defined in this way, as the successively non-overlapped regions of successive subpattern writing fields, rather than the other way around.

The maximum writing field 88 for the electron beam at one instant during the writing of a subpattern (later to be called subpattern 86-1) in subpattern writing field 84-1 is shown as a dashed rectangle labelled 88-1. As the subpattern 86-1 (not shown in FIG. 2) is written in subpattern writing field 84-1, the maximum writing field 88 (shown at one instant with label 88-1) gradually moves towards the next successive subpattern writing field, as illustrated by arrow 90-1. It should be noted that the maximum writing field is larger than the subpattern writing fields so that it can be gradually moved towards the next subpattern writing field while still completely covering the current subpattern writing field. When a subpattern has been completed within a subpattern writing field, the next subpattern is immediately begun in the next subpattern writing field. The subpattern writing field thus abruptly changes or shifts to the next successive subpattern writing field. The maximum writing field is the maximum field within which the electron beam can be deflected without undesirable distortion. Since this field (the maximum writing field) is determined by the relative position of the workpiece table with respect to the electron beam column, it cannot be abruptly changed. In accordance with this invention, the size of the subpattern writing fields and the amount of shift between successive subpattern writing fields is selected in relation to the size of the maximum writing field such that the maximum writing field can always be moved to a position where it bridges or completely covers two successive subpattern writing fields. The workpiece table is moved gradually to successive bridging positions so that while a subpattern is being written, the maximum writing field covers that associated subpattern writing field and when the abrupt shift from one subfield writing field to the next occurs, the maximum writing field bridges or covers both the present and the next subpattern writing field. In this way the maximum writing field always covers the subpattern writing field in use and allows an abrupt change to the next subpattern writing field without requiring the table (or the maximum writing field associated with it) to move. As illustrated in FIG. 2, successive overlapping subpattern writing fields are arranged in a generally serpentine pattern. Each successive subpattern writing field corresponds to a shift of a predetermined distance, first going in one direction (right in FIG. 2) until a row is completed, then perpendicularly thereto (downward in FIG. 2) for a few shifts until a new row is reached (which may or may not overlap the previous row), then in the opposite direction (left in FIG. 2) to form the next row, and so on.

FIGS. 3.1–3.5 illustrate how a composite pattern is formed from successive subpatterns. FIG. 3.1 illustrates a first subpattern, the elements of which have been labelled 86-1 in accordance with the labelling convention adopted with respect to FIG. 2. FIG. 3.2 represents the next subpattern, the elements of which are labelled 86-2. FIG. 3.3 shows the third subpattern elements labelled 86-3 and FIG. 3.4 shows the fourth subpattern elements labelled 86-4. In FIG. 3.5 the subpatterns have been superposed. Each successive subpattern has been shifted to the right by one quarter of the subpattern width to yield the composite exposure pattern shown in FIG. 3.5. As shown, each subpattern finishes the pattern exposure of the region corresponding to the left quarter of the subpattern (left of the dotted line), unless this has already occurred as in the FIG. 3.4, and continues to write in the right three-quarters of the subpattern writing field as time permits. An array of similar shapes such as shown in FIG. 3.3 may be written in this manner over an entire subpattern writing field. This is a particularly convenient capability because it allows the pattern data to be represented in a compact form. Different shading is shown for each subpattern for illustration purposes only.

Figure 4:
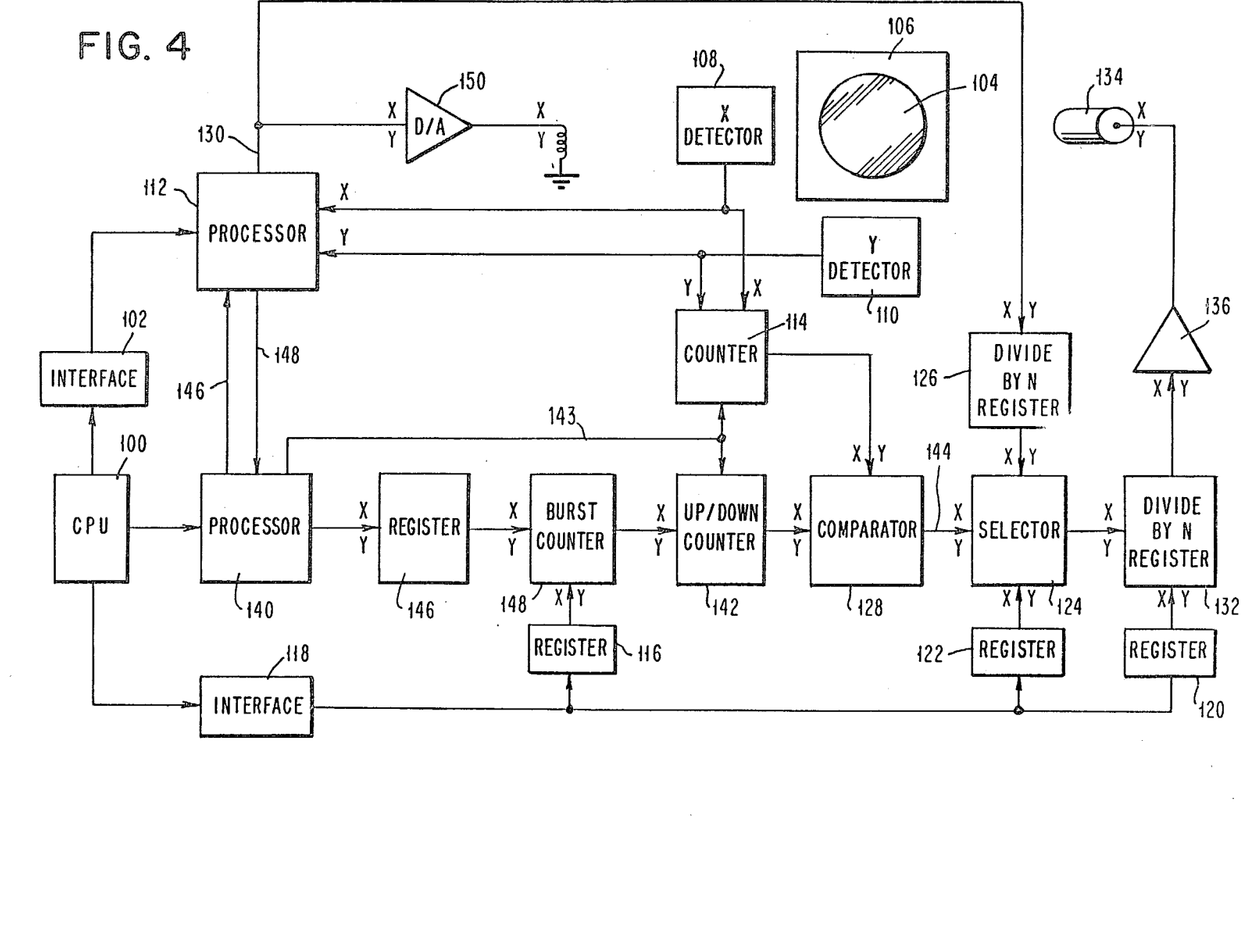
FIG. 4 is a delayed block diagram of an electron beam exposure system in accordance with this invention.
Figure 31:
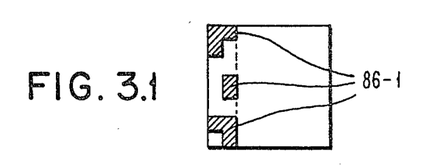
Figure 32:
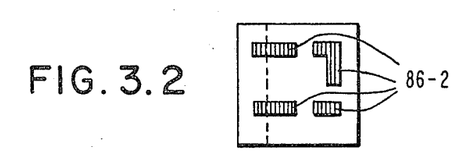
Figure 33:
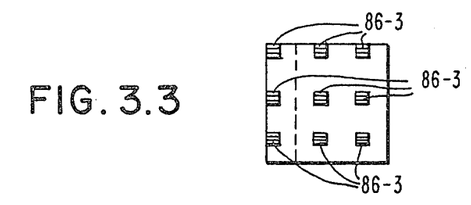
Figure 34:
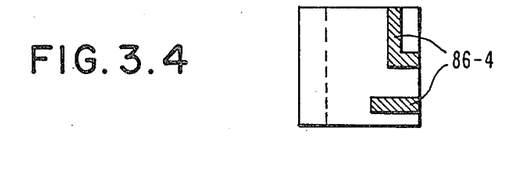
Figure 35:
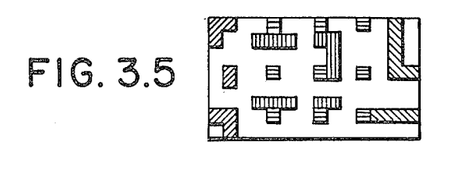

FIG. 4 is a detailed block diagram of an electron beam pattern writing system which uses the data formats illustrated in FIGS. 5.1–5.5. A collection of 16 bit words comprises a data set which forms a complete pattern. There are five different types of words. When the most significant bit (the left most bit labelled as the first bit) is a "1", the word is identified as a control word. Otherwise, the word is identified as a pattern data word.

Figure 51:
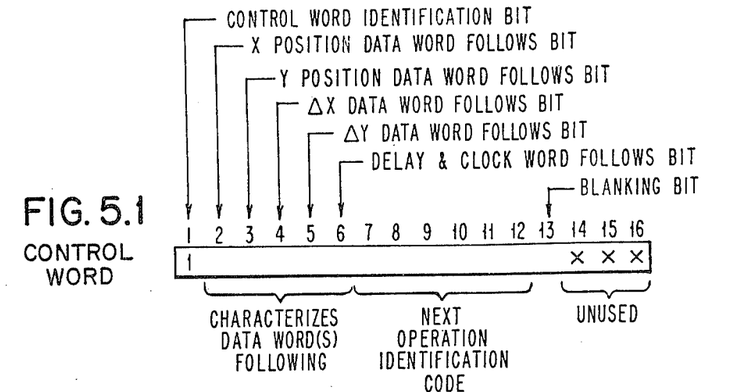

A control word (FIG. 5.1) identifies what type of data will follow the control word so that the following word or words can be properly handled. If the 12th bit is a "1", for example, the next word is automatically identified as an auxiliary register word to be loaded in an auxiliary register. As will be explained in further detail during a sequential description of the system operation, the auxiliary register holds information which tell the system which direction to step in order to get from one reference position to the next and whether or not registers should be reset. In general, the 7th through the 12th bits provide an "OP CODE" which identifies what the next system operation will be. The 000001 OP CODE identifies the operation to be performed as an auxiliary register loading of the next word. Other OP CODES identify what type of shape or pattern will be written next. For example, the 001000 OP CODE identifies the next shape to be written as a rectangle. Other OP CODES identify a triangle, a trapezoid, etc.

The second through the sixth bits of a control word identify the types of data words which will follow when the OP CODE part indicates that a pattern shape is to be written. A "1" in the second bit position indicates that the next word will be an X position word identifying the X position of the next shape to be written with respect to reference position. A "1" in the third bit position indicates that a Y position word will follow identifying the Y position of the next shape to be written. A "1" in the fourth bit position indicates that a word describing the size of the shape in the X direction will follow. A "1" in the fifth bit position indicates that a word describing the size of the shape in the Y direction will follow. A "1" in the sixth bit position indicates that a word will follow describing the amount of time to wait before starting to write the shape (time delay) and the clock rate for scanning the shape (which controls the exposure dose). Data words follow the control word in serial fashion with the X position word (if any) first, then the Y position word (if any), etc.

The thirteenth bit in a control word indicates whether or not the beam will be blanked during the next operation. The fourteenth, fifteenth and sixteenth bits are not used.

Figure 52:
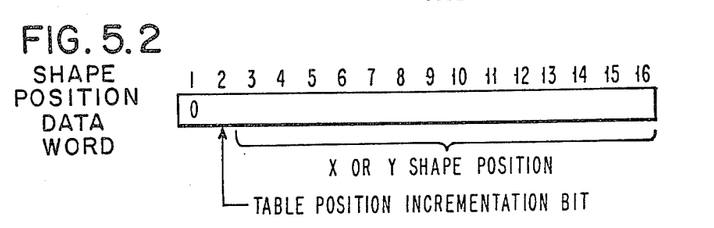

Both X position data words and Y position data words are illustrated in FIG. 5.2. The first bit position is a "0" to indicate that the word is not a control word. Bit positions 3 through 16 identify the position of the shape to be written either in the X or Y direction. If both an X and a Y position is needed, two words are used. When the next shape is not accompanied by a new value for one of the five word parameters (X position, Y position, X size, Y size, Delay-Clock), the missing parameters are assumed to be the same. Accordingly, if the next shape is the same except for the X position, only an X position word follows the control word.

The second bit position in an X position word indicates whether or not the desired table position should be incremented by one unit in the X direction. The sign of the increment (plus or minus) is held in a system register which is updated through use of an auxiliary register word. The second bit position in a Y position word indicates similarly whether or not the desired table position should be incremented by one unit in the Y direction. The sign of the increment is again held in a system register until changed by an auxiliary register word.

Figures 53, 54:
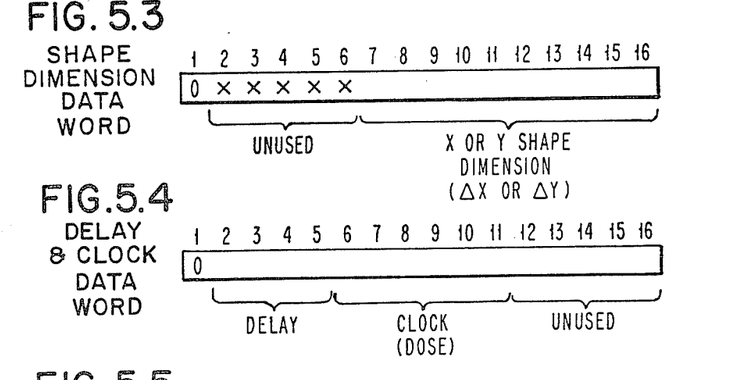

Both X size data words and Y size data words are illustrated in FIG. 5.3. The seventh through the sixteenth bits carry the size information. The first bit is a "0" to identify the word as not being a control word. Bits 2-6 are not used.

Delay-clock words are illustrated in FIG. 5.4. Bit position 1 is a "0" to identify the word as not being a control word. Bits 2-5 code an amount of delay which should elapse before the shape is written. There are times when intentional delay is desirable so that the table can make a large move, for example. This provides such capability. Bits 6-11 specify the clock rate and therefore the dwell time during scanning of a shape. Exposure dose is controlled with these bits. Proximity correction is implemented using these bits. Bits 12-16 of a delay-clock word are not used.

Figure 55:
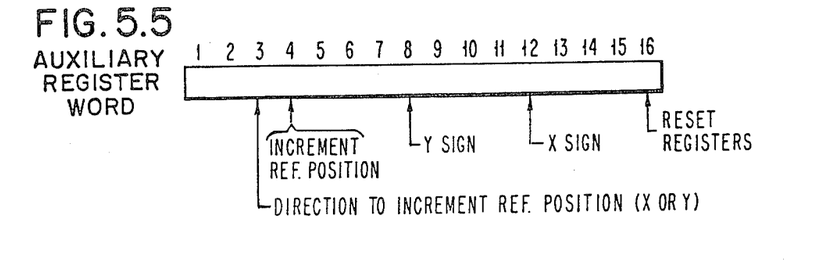

An auxiliary register word is illustrated in FIG. 5.5. Only 5 bits are used. A "1" in the sixteenth bit location resets system registers. A "1" bit in the fourth bit position causes pattern writing to stop momentarily while the reference position for the next shapes to be written is changed (incremented). The axis along which the reference position is to be incremented is indicated by the third bit. A "1" in the third bit position indicates a Y direction increment while a "0" in the third bit position indicates an X direction increment. The eighth bit position indicates which direction the increment is to be made if it is in the Y direction. The twelfth bit position indicates which direction the reference position is to be changed if the increment is to be made in the X direction.

System operation will now be described by reference to FIG. 4. After power is turned on, a central processing unit (CPU) 100 resets all the data channels connected to interface 102. Interface 102 preferably is an IEEE 488 type. A workpiece 104, such as an electronic wafer is mounted onto workpiece table 106. Data is then loaded into the CPU describing the pattern to be written, and the wafer layout if the pattern is to be repeated many times at different locations on the wafer.

This invention pertains to a continuously written stitched pattern (say the pattern exposure for a single chip site). However, such a pattern may be and typically is repeated at many different sites on a wafer. In general, writing cannot very well be continuous during the move to a new chip site. Accordingly, two different modes of operation are needed, a continuous writing mode and a stepping mode. In general it is contemplated that the continuous writing mode will control system operation while a chip site is being written and stepping mode will control system operation while the table is moving the writing field to a new chip site on the same wafer.

When the above described type of two mode operation is used, it is necessary to keep track of the workpiece position in two different frames of reference. The actual position of the wafer with respect to the maximum writing field is measured directly using a two axis laser interferometer of conventional design and operation. Only the X and Y interferometer detectors 108, 110 are shown in FIG. 4. The actual absolute position of the wafer is calculated by processor 112 by adding pulses from the laser interferometer detectors. Each pulse corresponds to a distance of $\lambda/8$, where $\lambda$ is the wavelength of the laser (not shown). A more detailed description of a laser interferometer system can be obtained for example from the earlier cited references. Processor 112 stores the absolute actual position of the wafer because the position counts by processor 112 are initialized (or reset) only once during the whole writing process associated with the wafer. This is done at the same time that initial wafer alignment is done.

Another actual position of the workpiece with respect to the maximum scan field is stored in counter 114. This actual position for the workpiece is measured with respect to each chip site on the wafer. Accordingly, this register holds the wafer position with respect to the chip site and is reset via line 143 before each chip pattern is written. It should be understood that a realignment for each new chip site is not necessary because wafer layout information is given to the CPU and processor 112 keeps track of the absolute actual position of the wafer.

Continuing now with the description of the sequential operations of this system, the CPU computes the location of the first chip site. If the scaling factors of the system are not preset, they are now set automatically or manually as appropriate. Scaling factors control the distance the table is to move for each table movement marker bit located in pattern data, which is typically less than 50 microns.

The X and Y directions can have different scaling factors but it is expected that they will typically be the same. In FIG. 4 one scaling factor (one for X and one for Y) is stored in register 116 via interface 118. Another scaling factor is the incremental stepping distance of the table which is stored in register 120 (one factor for X and one for Y).

The CPU next sends the computed location of the first chip site to processor 112 via interface 102 and sets register 122 via interface 118 to "step and repeat mode". This causes selector 124 to take its input from "divide by N" register 126 rather than comparator 128.

The CPU next instructs processor 112 to "track", which causes the processor to compare the chip site coordinates just sent by the CPU with the actual absolute position of the wafer stored by processor 112. This absolute position was obtained by processor 112 by counting pulses received from the interferometer detectors from the time of the reset at initial alignment. The difference between these positions results in an error signal on lines 130. The divide by N register 126 scales this error down because it is also used in the "continuous writing mode" to correct the position of the pattern writing beam and thus has a very high resolution. The error is scaled down again by another divide by N register 132 and converted to a drive signal for servo motor 134 by driver amplifier 136. It should be emphasized that most elements and lines are shown and described with respect to only one coordinate axis. In reality there are two coordinate axes and consequently two servo motors 134, two driver amplifiers 136, etc. Servo motors 134 drive the table so as to reduce the error until the actual position of the table corresponds with the chip site sent by the CPU to processor 112.

When a null circuit (not shown) senses that the table is close enough to the first chip site the tracking associated with the "continuous writing mode" will lock in, and the mode is changed. First, the CPU resets counter 114 and counter 142 via lines 143 by sending an appropriate auxiliary register word to the processor 140. Then the CPU switches modes at selector 124 by sending an appropriate command to register 122. Next, the CPU sends pattern data to processor 140. The first pattern data word is a control word which loads the second word into the auxiliary register. This second word identifies the initial direction in which the successive subpatterns will be written. The third pattern data word is another control word identifying the first shape type to be written and the five shape parameter words previously described (i.e. an X position word, a Y position word, an X size word, a Y size word, and a delay-clock word). One or both of the position words may in general contain a "1" in the second bit position.

Pattern data is continuously sent by the CPU to processor 140 as needed. If we assume that successive subpatterns will be shifted in the +X direction then "marker bits" ("1" bits in the second bit position of X position data words) will appear in some of the X position words.

Marker bits are stored in a FIFO register 146 along with the direction (plus or minus). The direction is set in processor 140 by using an auxiliary register word. Marker bits are clocked out of register 146 and multiplied by a factor stored in register 116 by burst counter 148. The pulses from burst counter 148 are counted by up/down counter 142. Counter 142 keeps track of the desired position for the table. Comparator 128 compares the desired position in counter 142 with the actual position in counter 114 and generates an error signal on line 144. Error signal 144 passes through selector 124 (since "continuous writing mode" has been selected via register 122) and divide by N register 132 to drivers 136 and servo motors 134. Servo motors 134 drive the table so as to reduce the error. Accordingly, table 106 tracks the position in register 142.

After the first subpattern has been completely written and the table has moved in small increments many times, a control word loads an auxiliary register word with a "1" in the fourth position (see FIG. 5.5). This causes the direction (bit 3) and sign (either bit 8 or bit 12) of a reference position shift to be sent from the auxiliary register in processor 140 to processor 112 via line 146. Processor 112 updates or corrects the stored reference position and signals to processor 140 that this has been done via line 148.

It should be noted that the size of the step in the reference position stored by processor 112 corresponds to the step between successive subpatterns. The next subpattern data which reaches processor 140 from the CPU is referenced to this new position. The reference table position stored by processor 112 and changed for each subpattern is continually compared to the actual table position also stored in processor 112. The difference (an error signal) travels via line 130 to D/A converter 150, which produces an offset deflection at the electron beam column which exactly compensates for the measured error.

When the last subpattern has been written, the chip is finished. The CPU then turns off the "continuous writing mode", computes the next chip site and sends the new site to processor 112. The whole exposure pattern is then repeated again at the new site.

While the invention has been shown and described by reference to a particular and preferred embodiment thereof, it will be easily appreciated by those skilled in this art that changes in form and details may be made therein without departing from the spirit and scope of this invention, as defined by the following claims.

Having thus described our invention, what we claim as new, and desire to secure by Letters Patent is:

1. Apparatus for writing a pattern having a size larger than the maximum writing field of a writing beam, comprising:

means for generating a writing beam which may be positioned anywhere within a maximum writing field, pattern data defining a desired pattern to be written which is larger than said maximum writing field, said pattern data being partitioned into successive sets of subpattern data, said successive sets of subpattern data defining adjacent subpatterns to be successively written without interruption, each subpattern having a reference position for the workpiece associated therewith, any two successive subpatterns together being no larger in any dimension than said maximum writing field;

workpiece position data associated with said pattern data and defining successive desired positions of a workpiece with respect to said maximum writing field, said desired successive workpiece positions being spaced from each other by distances which are small in comparison with the size of said subpatterns said successive desired workpiece positions being such that said subpatterns to be successively written without interruption, when referenced to the workpiece, always lie within said maximum writing field if the workpiece is positioned at the currently desired workpiece position associated with the pattern data being written or at a position in transit to said currently desired workpiece position from the previously desired workpiece position;

servo means tending to automatically keep a workpiece at the desired successive workpiece position;

means for continuously measuring the actual position of the workpiece;

means for measuring the error between the measured actual position of the workpiece and the current reference position for the workpiece and means responsive to said measured error for referencing a subpattern being written with respect to the workpiece, whereby no interruption in pattern writing is required for workpiece movements.

2. Apparatus as defined in claim 1 wherein said successive subpatterns are overlapping.

3. Apparatus as defined in claim 1 wherein said workpiece position data and pattern data are associated with each other by storing said position and pattern data together in an interleaved fashion.

4. Apparatus as defined in claim 1 wherein said means for referencing a subpattern with respect to the workpiece comprises means for applying a bias deflection to the writing beam.

5. Apparatus as defined in claim 1 wherein successive subpatterns overlap each other by at least 50 percent.

6. Apparatus as defined in claim 1 wherein successive subpatterns overlap each other by about 75 percent.

7. Apparatus as defined in claim 1 wherein the distance between successive table positions is much less than the displacement between successive subpatterns to be written, the workpiece position being changed many times during the writing of a single subpattern.

8. Apparatus as defined in claim 1 wherein the desired workpiece position is changed each time by a unit distance.

9. Apparatus as defined in claim 1 wherein the desired workpiece position is changed each time by a distance less than 50 microns.

10. Apparatus as defined in claim 1 wherein the workpiece position data is represented as incremental movement data and is combined with pattern data to form unit blocks of combined pattern and workpiece movement data.

11. Apparatus as defined in claim 1 wherein said means for measuring the actual position of the workpiece is a laser interferometer.

* * * * *